INVENTOR:
ROGER W. SWANSON,
BY Walter C. Bernkopf
HIS ATTORNEY.

Jan. 29, 1963
R. W. SWANSON
3,076,151
AFC WITH SEARCH SWEEP CONTROL
Filed Dec. 31, 1959
2 Sheets-Sheet 2

INVENTOR:
ROGER W. SWANSON,
BY Walter C. Bemkopf
HIS ATTORNEY.

3,076,151

AFC WITH SEARCH SWEEP CONTROL

Roger W. Swanson, De Witt, N.Y., assignor to General Electric Company, a corporation of New York Filed Dec. 31, 1959, Ser. No. 863,358
2 Claims. (Cl. 331—4)

This invention relates to signal processing arrangements and particularly to methods and means for providing a highly stable frequency source.

The increased use of radio communications, and the consequent crowding of the available radio spectrum, has required an increase in the frequency stability requirements for operating equipments. The expanded use of new modulation techniques such as double side band systems has also increased the need for highly stable frequency sources. The requirement has been generated for a frequency synthesizer that generates an output signal of high frequency stability whose frequency can be adjusted to be precisely at the mid-frequency of a plurality of other signals. A disclosure of such a system is made in U.S. Patent 2,868,981—entitled "Signal Processing Arrangement," by John P. Costas, assigned to the assignee of the present invention, which is included herein by reference. The system disclosed therein provides an output signal of high frequency stability which may be selectively set to a desired frequency within a wide frequency band by placing the output signal frequency precisely at the mid-frequency of a plurality of harmonic, or reference, signals generated by a stable frequency oscillator. In this system a controlled signal source, such as an oscillator, which provides the output signal, is initially tuned so that this desired frequency relationship is achieved and a phase locking circuit subsequently automatically maintains the controlled oscillator output at the proper frequency by means of a phase control feedback loop. The phase control loop must generally be designed, because of noise and other considerations, to permit only a very small control loop pull-in range so that the controlled oscillator frequency must be adjusted to be within a very narrow frequency band before the phase-lock loop takes over control of the output signal frequency. Operation of such a "between harmonics" lock system, therefore, requires, in addition to an initial approximate frequency adjustment of the controlled source, a very precise frequency adjustment to tune the source to within this small pull-in range, i.e. the narrow frequency tolerance band within which there can be a phase lock between the output signal and the reference signals. In addition to requiring a very critical manual adjustment there is also the possibility that the system may lose its phase lock upon the occurrence of power transients or momentary power interruptions.

It is an object of this invention to provide a frequency synthesizer capable of providing an output reference frequency without requiring a manual phase lock adjustment.

It is a further object of this invention to provide a frequency synthesizer which will provide a frequency stabilized output continuously despite momentary transients or power interruptions.

It is a further object of this invention to provide an improved automatic frequency arrangement.

It is a still further object of this invention to provide an automatic frequency lock-on circuit capable of automatically adjusting the frequency output of a controlled source to be precisely equal to one-half of the sum of two displaced reference frequencies.

It is a still further object of my invention to provide a "between-harmonics" lock system having an automatic frequency control loop which will automatically adjust the output frequency of a controlled source to be within the pull-in range of the phase control loop of the system.

In accordance with one embodiment of my invention, there is provided a source of first and second reference signals of frequency $f_a$ and $f_c$ respectively, a controlled source providing a third signal of frequency $f_b$, control means coupled to the controlled source so as to vary frequency $f_b$ independently of the first and second signals, means for comparing the three signals corresponding to $f_a$, $f_b$ and $f_c$ to derive a control signal, and means for applying the control signal to disable the control means provided for when the output frequency $f_b$ of the controlled source is substantially equal to one-half the sum of the frequencies of the first and second source.

While the specification concludes with claims particularly pointing out and distinctly claiming the subject matter which is regarded as the invention, it is believed that the invention will be better understood as the following description is taken in connection with the accompanying drawings in which:

Figure 1:
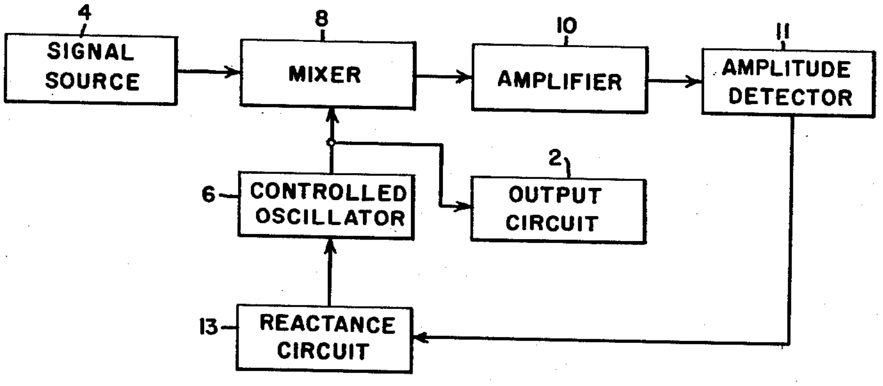
FIG. 1 is a block diagram of a prior art type of frequency synthesizer.

Referring to FIG. 1, there is shown the system disclosed in the referenced Costas patent for obtaining an output signal at high frequency stability which may be selectively set to a desired frequency within a wide frequency band. The system operates by spacing the output signal frequency, generated by a controlled oscillator 6, precisely at the mid-frequency of a plurality of harmonic, or reference, signals supplied by signal source 4. The source 4 may contain a stable reference wave source, such as a crystal controlled oscillator, whose output is supplied to a harmonic generator which provides a plurality of harmonically related signals, as for example, reference signals of frequency $f_a$ and $f_c$ shown in FIG. 2.

Figure 2:
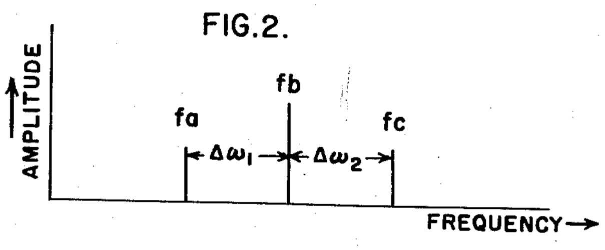
FIGS. 2 and 3 illustrate graphically certain waveforms useful in explaining the operation of the present invention.

The controlled oscillator 6 provides, to an output circuit 2, a signal $f_b$ which may be adjustable over a large frequency range. The oscillator is adjusted so that its output signal $f_b$ is at a mid-point between frequencies $f_a$ and $f_c$. A phase control loop, including mixer 8, amplifier 10, amplitude detector 11, and reactance circuit 13, subsequently maintains the controlled oscillator frequency at the precise mid-point between frequencies $f_a$ and $f_c$. Thus the controlled oscillator output frequency $f_b$ is maintained equal to $$\frac{f_a+f_c}{2}$$

and has a frequency accuracy corresponding to that of the reference signals. The relative frequency relationship between signals $f_a$, $f_b$, and $f_c$ is shown in FIG. 2 where the frequency is plotted as the abscissa and the signal current is plotted as the ordinate. It will be noted that the frequency spacing between the frequencies $f_a$ and $f_b$, $\Delta w_1$, is equal to the frequency spacing between frequencies $f_b$ and $f_c$, $\Delta w_2$. The multiplication of signals $f_a$, $f_b$, and $f_c$ in mixer 8 provides an output which has a signal frequency equal to the difference between frequencies $f_a$ and $f_b$, and thus also of $f_b$ and $f_c$. The amplitude of the mixer output signal, which is a function of the phase difference between reference signals $f_a$ and $f_c$ and output signal $f_b$, after amplification by amplifier 10, is amplitude detected by detector 11. The detector output controls the reactance of reactance circuit 13 and thus the output signal $f_b$ of oscillator 6. Exceptional frequency stability of signal $f_b$ is obtained by this phase locking process.

Figure 3:
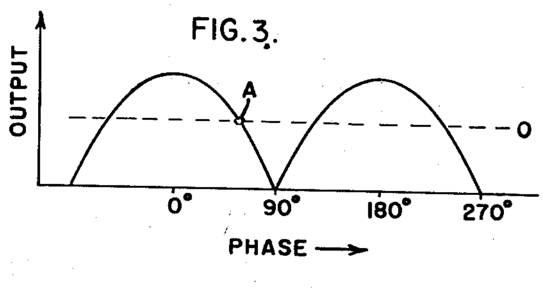

The relationship between the amplitude of the control signal output from amplitude detector 11 and the phase relationship between the reference signals, $f_a$ and $f_c$, and the output signal $f_b$ is illustrated in FIG. 3 with phase plotted as the abscissa and output amplitude plotted as the ordinate. This characteristic curve indicates that the amplitude detector output is substantially zero when the control oscillator output phase and the equivalent carrier phase of the two harmonic generator outputs are either at 90° or 270° with respect to each other. In order to achieve phase control for either direction of phase shift, the phase lock circuit is normally operated with a phase shift between the harmonic generator and the control oscillator outputs such that there is a discrete amplitude output from amplitude detector 11 when the system is phase-locked. Point A illustrates this quiescent operating point and the dashed reference line 0 of FIG. 3 illustrates the quiescent amplitude level of the control signal from the amplitude detector under this condition. When there is a transient in the system or when there is a momentary interruption of applied power, the voltage output of detector 11 may be varied sufficiently from this quiescent level to disable the phase-lock circuit and requires that the controlled oscillator be readjusted to provide phase lockup. Adjustment of the controlled oscillator to provide phase lockup is extremely critical since the controlled oscillator must be adjusted to be within the pull-in range of the phase lock-loop. In the past such adjustment has required manually adjusting the controlled oscillator output frequency until the output of amplitude detector 11 reached a predetermined value. In a typical operative embodiment, for example, the controlled oscillator which was tunable over a 10 megacycle range had to be adjusted within a pull-in range of about 250 cycles.

Figure 4:
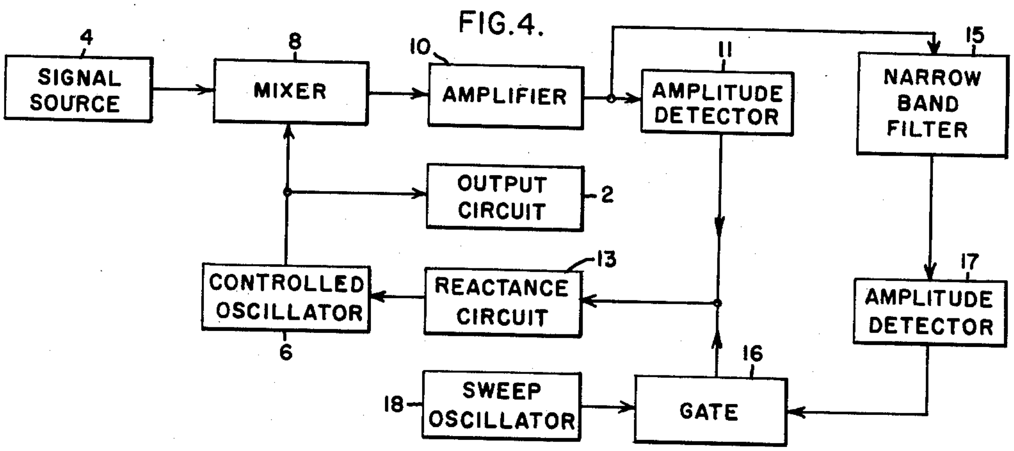
FIG. 4 is a block diagram of one embodiment of the invention.

In view of the above mentioned difficulties in obtaining and maintaining phase lock, it is desirable to have an automatic frequency lock feature which achieves phase lockup and maintains such lockup even with transients or temporary interruptions. With this feature phase lockup is automatically obtained when the controlled oscillator frequency is adjusted within a broad range of the desired frequency, for example +25 kc. when the reference signals are spaced 100 kc. apart. FIG. 4 illustrates one embodiment of a system having such an automatic frequency lock feature. The system illustrated is identical to that disclosed in FIG. 1, with like circuits being identified with like numerals, but for the addition of an automatic-lock circuit which includes narrow band filter 15, amplitude detector 17, gate 16 and sweep oscillator 18. As in the prior art system, the signal source 4 may incorporate a crystal oscillator whose output is applied to a harmonic generator so as to provide the desired plurality of output signals. The standard crystal oscillator may thus have its output amplified and suitably shaped. This output may then be applied to a blocking oscillator which produces short sufficiently squared pulses to provide harmonically related output signals over a large frequency band. In one operative embodiment, for example, the crystal oscillator provided a reference signal of 100 kilocycles which controlled the harmonic generator which provided 100 kc. harmonics extending over a frequency band of at least 10 megacycles. The controlled oscillator may be of any standard type which permits manual tuning over the desired freqency band. In a preferred embodiment, for example, this extended up to 10 megacycles. The oscillator 6 output and the reference signals from source 4 are supplied to mixer 8, which may be of standard design, such as a pentagrid converter, having an output load tuned to the desired frequency difference signal. In the preferred embodiment this mixer output frequency was established at 150 kilocycles. Proper operation may be achieved from $f_c-f_b$, and $f_b-f_a$ equal $fm$, the desired mixer output frequency. For example, when $fm=150$ kilocycles, the controlled oscillator output signal $f_b$ may be set to 5.05 megacycles so as to be multiplied with reference signal frequencies $f_a$ and $f_c$, of respectively 4.9 and 5.2 megacycles. The A.-C. output signal from mixer 8 can be amplified by amplifier 10 which may be tuned to have a bandwidth sufficiently narrow, such as for example from 1 to 5 kilocycles, to discriminate against noise and signals other than the desired 150 kc. signal. The output of amplifier 10 is amplitude detected by amplitude detector 11, which may be a standard r.m.s. detector. In a preferred embodiment the peak amplitude output of this detector was approximately 4 volts.

The reactance circuit 13 and its coupling to the controlled oscillator 6 may be of standard design as disclosed, for example, in "Electron Tube Circuits," Seely 1st Ed., 1950, McGraw-Hill Book Company, Inc., on pages 374–377, or Radiotron Designers' Handbook, 4th Ed., 1953, Wireless Press, pages 1151 and 1156–1160. The reactance circuit should of course be designed to provide a proper ratio of controlled oscillator frequency excursion to applied control voltage. In a preferred embodiment this ratio was approximately 7 kilocycles per volt.

The automatic frequency lock circuit includes narrow band filter 15, sweep oscillator 18, amplitude detector 17, and gate 16. The sweep oscillator 18 output, which is normally applied through gate 16 to the reactance circuit 13, provides to the reactance circuit a signal which varies the control oscillator output frequency. It is desirable to have a sweep oscillator output signal whose peak amplitude causes the controlled oscillator output frequency $f_b$ to vary over a frequency range greater than any possible error between the indicated and the actual output frequency of the controlled oscillator, so that the actual controlled oscillator output frequency will by the action of sweep oscillator 18, pass through the preselected frequency at which phase lockup can be obtained. In the preferred embodiment, for example, the sweep oscillator 18 provided an output signal having a peak amplitude, of about 4 volts, which was sufficient to swing the controlled oscillator through a range of ±25 kilocycles. Thus if it is assumed that the pull-in range of the phase lock circuit is ±250 cycles, i.e. the controlled oscillator output frequency $f_b$ must be within 250 cycles of $$\frac{f_a+f_c}{2}$$

to provide lockup. The controlled oscillator 6 upon being adjusted to within ±25 kc. of the desired frequency $f_b$ will provide an output during the cycle of sweep oscillator operation which will bring the controlled oscillator frequency within the pull-in range and thus provide phase lockup of the controlled oscillator 6. The frequency of the sweep oscillator must be chosen properly to provide accurate phase lockup. If the sweep oscillator sweeps too fast, the controlled oscillator output frequency will be swept through the lock postion too quickly and the phase lockup loop may never be able to lock the oscillator at the correct frequency. For this reason the sweep oscillator frequency should be preferably low, for example not greater than 10 cycles per second. It is obvious, of course, that if the sweep oscillator frequency is too low it will take the control loop an excessive time to lock up the control oscillator. In a preferred embodiment of the system the sweep oscillator frequency was therefor chosen to be 2.5 cycles per second. It is desirable to disengage the sweep oscillator once phase lock is achieved, because otherwise the sweep oscillator might throw the system out of phase lock or may phase modulate the signal in the phase lockup loop. It is therefore necessary to provide means for disabling or disconnecting the sweep oscillator from the reactance circuit when the system is in phase lockup. This is achieved by normally opened gate 16, which is controlled by the A.-C. signal shown coupled from amplifier 10 through narrow band filter 15. As was previously stated the output of mixer 8, and thus of amplifier 10, was a signal having a frequency equal to the multiplication product of the signals $f_a$, $f_c$, and $f_b$ which, when phase lock is achieved, has a frequency equal to $f_a$ minus $f_b$ divided by 2. This signal is coupled through a narrow band filter 15 which has a corresponding pass frequency and a band width not exceeding the pull-in range of the phase lock loop circuit. For example, in a preferred embodiment having a phase lock frequency of 150 kilocycles and a pull-in range of about 250 cycles, a crystal filter having a pass band of approximately 150 kilocycles ±3 cycles was employed.

Figure 5:
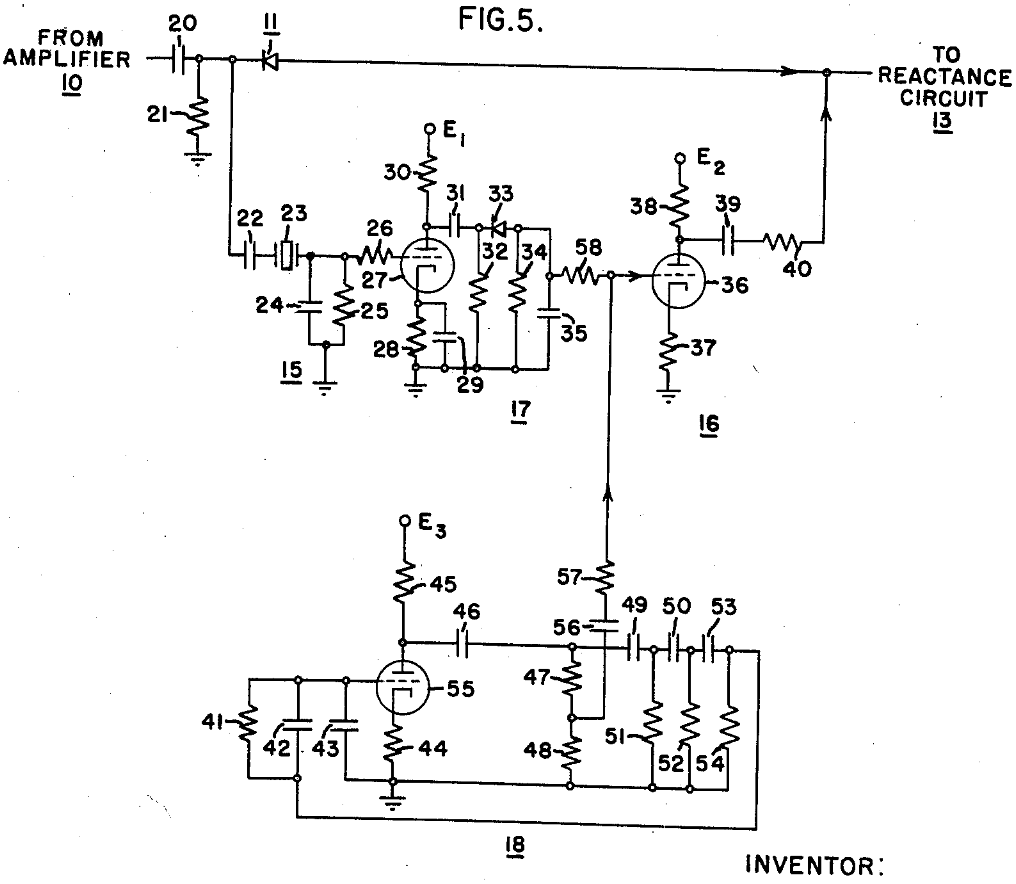
FIG. 5 is a schematic diagram of one embodiment of the frequency control loop of the present invention.

FIG. 5 illustrates a preferred embodiment of the automatic frequency lock control circuit and the portion of the phase lock loop extending between the outputs of amplifier 10 and the input of reactance circuit 13. This embodiment is provided only for purpose of example and should not be considered as limiting the scope of the invention. The output from amplifier 10 is coupled through coupling capacitor 20 and the associated load resistance 21, through diode 11, the amplitude detector of the phase control loop, to reactance circuit 13. The automatic frequency lock circuit includes sweep oscillator 18 whose output is connected through normally opened gate circuit 16 to reactance circuit 13. A gate control circuit is connected from the output of amplifier 10 through narrow band filter 15 and amplitude detector 17 to gate 16.

Sweep oscillator 18 is a conventional RC feedback oscillator. The oscillator employs triode 55 whose cathode is connected to ground through resistor 44 and whose plate is connected to a source of positive voltage $E_3$ through resistor 45. Four staggered RC sections are connected to the plate circuit including serially connected capacitors 46, 49, 50, and 53. One side of capacitor 46 is connected to the plate of triode 55 and one side of capacitor 53 is connected through the grid lead circuit comprising parallel connected resistor 41 and capacitor 42 to grid of the triode. Four resistors, are respectively, connected from the junctions of the capacitors to ground. Thus serially connected resistors 47 and 48 are connected from the junction of capacitors 46 and 49 to ground, resistors 51 is connected from the junction of capacitors 49 and 50 to ground. Resistor 52 is connected from the junction of capacitors 50 and 53 to ground and resistor 54 is connected from the junction of capacitor 53 and the grid network to ground. A capacitor 43 is connected from the grid of triode 55 to ground in order to enhance oscillation. The oscillator output is coupled from the junction of resistors 47 and 48 through a decoupling network comprising serially connected capacitor 56 and resistor 57 to the grid of gating tube 36, which forms part of the gate circuit 16. This output coupling arrangement places low loading on the sweep oscillator in view of the high impedance of the decoupling circuit, the high impedance coupling from amplitude detector 17, and the tapped output arrangement of resistors 47 and 48.

The gate circuit 16 comprises triode 36 having its cathode connected through resistor 37 to ground, and its plate connected through resistor 38 to a source of positive voltage $E_2$. The output of the gate 16 is coupled from the plate through series connected capacitance 39 and resistor 40, which serves as a decoupling impedance, to the input of reactance circuit 13. The above described circuitry provides a low frequency sweep output from sweep oscillator 18 which is coupled through gate 16 and supplied to reactance circuit 13.

The gate is controlled by the series circuit coupled from amplifier 10 to the gate input which includes the narrow band filter 15 and the amplitude detector 17. The narrow band filter includes a serially connected coupling capacitance 22 and crystal filter 23. The output of the crystal is connected through resistor 26 to the grid of triode amplifier 27 of the amplitude detector. The parallel RC circuit comprising capacitor 24 and resistor 25 is connected from the output side of the crystal to ground. The capacitor 24 serves as a transient filter while resistor 25 serves as a load impedance of the amplitude detector input, while resistor 26 prevents the amplifier 27 from being overdriven. The amplitude detector circuit 17 includes amplifier triode 27 whose cathode is connected through parallel resistor 28 and capacitor 29 to ground, and whose plate circuit is connected through resistor 30 to a positive voltage source $E_1$. The output of triode 27 is coupled through serially connected capacitor 31 to detector 33, whose output is subsequently applied through the coupling resistor 58 to the grid of the gate tube 36. The detector circuit is completed by means of resistor 32, connected from the junction of detector 33 and coupling capacitor 31 to ground, and the parallel network comprising resistor 34 and capacitor 35 connected from the output side of detector 33 to ground.

The sweep oscillator 18 provides a continuous sweep output of low frequency. In a preferred embodiment, for example, the sweep output had a frequency of 2.5 cycles per second. This output is normally coupled through the gate 16 and coupled from the output of tube 36 to the reactance circuit 13. When the controlled oscillator output frequency $f_b$ approaches the exact midpoint frequency between frequencies $f_a$ and $f_c$, so as to bring the signal frequencies within the pull-in range of the phase lock circuit, the output frequency from amplifier 10 will be approximately $f_a$ minus $f_c$ divided by 2. This signal, corresponding to the pass frequency of filter 15, will then be coupled through the narrow band filter 15, amplified by tube 27 and detected by detector 33. The detector is poled so that a negative signal output will be applied to the grid of gate tube 36, which is sufficient to cut off that tube and prevent any further application of the sweep oscillator signal to the reactance circuit 13. With a proper choice of parameters, the rate at which the sweep oscillator 18 is cut off may be controlled, so that there is a gradual signal cutoff as the system approaches phase lock. This gradual cutoff prevents the system from being thrown out of lock by the appearance of instantaneous power interruptions or power transients when the gating tube is initially cut off.

In one particular operative embodiment of the invention, the circuitry illustrated in the schematic of FIG. 5 utilized the following components. These component values are given only for the purpose of illustration and are not to be construed as being limiting.

Device 27=½ of 5814
Devices 36 and 55=each ½ of 6201
Capacitor 20=15,000 mmf.
Capacitor 22=.05 mf.
Capacitor 24=22 mmf.
Capacitor 29=.02 mf.
Capacitor 31=1800 mmf.
Capacitor 35=100 mmf.
Capacitors 39 and 56=0.1 mf.
Capacitor 42=2. mf.
Capacitor 43=330 mmf.
Capacitors 46, 49, 50, 53=.25 mf.
Resistor 21=22,000 ohms
Resistor 25=390,000 ohms
Resistor 26=11,000 ohms
Resistor 28=470 ohms
Resistor 30=18,000 ohms
Resistor 32=100,000 ohms
Resistor 34=680,000 ohms
Resistor 37=240 ohms
Resistor 40=100,000 ohms
Resistor 41=4.7 megohms
Resistor 44=470 ohms
Resistor 45=68,000 ohms Resistor 47=150,000 ohms
Resistor 48=68,000 ohms
Resistors 51, 52, 54=220,000 ohms
Resistor 57=330,000 ohms
Resistor 58=1 megohm
Diodes 11 and 33=Type 1N100
Crystal 23=150 kc. crystal (Northern Engineering Laboratories NE-13E)
$E_1$ and $E_3$=+250 volts
$E_2$=+150 volts It may be desirable to vary the parameters of the above listed parts, and it may indeed be desirable to employ other forms of component assemblies, i.e. amplifiers, detectors, gating circuits, and sweep oscillators. For example in some embodiments there will be no need to employ a controlled oscillator which is manually tuned. It may also be desired to employ a plurality of reference signals rather than the two which have been described for purposes of simplified description.

While the principles of the invention have now been made clear, there will be immediately obvious to those skilled in the art many modifications in structure, arrangement, proportions, the elements and components used in the practice of the invention, and otherwise, which are particularly adapted for specific environments in operating requirements without departing from those principles. The appended claims are therefore intended to cover and embrace any such modifications within the limits of the true spirit and scope of the invention.

What I claim as new and desire to secure from Letters Patent of the United States is:

1. In combination a first source of first and second signals of frequencies $f_a$ and $f_c$, respectively, a second source of third signals of frequency $f_b$, means for multiplying said signals $f_a$ and $f_c$ with said signal of frequency $f_b$ to derive a multiplied signal, normally closed gating means, first means independent of said multiplied signal coupled through said gating means for periodically varying the frequency of signal $f_b$ intermediate the frequencies of signals $f_a$ and $f_c$, means for opening said gating means and disconnecting said first means from said second source when the frequency of signal $f_b$ substantially equals $$\frac{f_a+f_c}{2}$$

comprising a narrow band filter having a band pass at a frequency of $$\frac{f_a-f_c}{2}$$

and detecting means serially connected from said multiplying means to said gating means, and phase control loop means responsive to said amplitude detected multiplied signal for subsequently maintaining the frequency $f_b$ equal to $$\frac{f_a+f_c}{2}$$

2. In combination a source of at least two signals $f_a$ and $f_c$ of substantially the same high stability but of different frequency, a controllable source of a signal of frequency $f_b$, means for multiplying said signals of frequency $f_a$ and $f_c$ with said signal of frequency $f_b$, to derive a resultant signal of a frequency dependent upon the multiplication products $f_b-f_a$ and $f_c-f_b$, first means independent of said resultant signal for varying the frequency of signal $f_b$ intermediate the frequencies of said signals $f_a$ and $f_c$, means for automatically locking the frequency $f_b$ of said controllable source at $$f_b=\frac{f_a+f_c}{2}$$

comprising normally closed switching means, said switching means connecting the output of said first means to said controllable source, a control circuit for opening said switching means comprising a narrow band filter having a pass frequency of $$\frac{f_a-f_c}{2}$$

and means for applying said resultant signal through said narrow band filter to said switching means when said multiplication products $f_b-f_a$ and $f_c-f_b$ equal $$\frac{f_a-f_c}{2}$$

References Cited in the file of this patent

UNITED STATES PATENTS

| | | |
|---|---|---|
| 2,287,925 | White | June 30, 1942 |
| 2,794,910 | Arends | June 4, 1957 |
| 2,833,923 | Gruen | May 6, 1958 |
| 2,868,981 | Costas | Jan. 13, 1959 |
| 2,884,519 | Masselin | Apr. 28, 1959 |

FOREIGN PATENTS

| | | |
|---|---|---|
| 550,056 | Canada | Dec. 10, 1957 |